United States Patent
Tamaki

(10) Patent No.: US 9,660,151 B2
(45) Date of Patent: May 23, 2017

(54) METHOD FOR MANUFACTURING LIGHT EMITTING DEVICE

(71) Applicant: NICHIA CORPORATION, Anan-shi, Tokushima (JP)

(72) Inventor: Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/716,627

(22) Filed: May 19, 2015

(65) Prior Publication Data

US 2015/0340547 A1   Nov. 26, 2015

(30) Foreign Application Priority Data

May 21, 2014   (JP) .................. 2014-105331

(51) Int. Cl.
*H01L 21/00* (2006.01)
*H01L 33/50* (2010.01)

(52) U.S. Cl.
CPC .......... *H01L 33/504* (2013.01); *H01L 33/502* (2013.01); *H01L 2224/16225* (2013.01); *H01L 2224/48091* (2013.01); *H01L 2224/48247* (2013.01); *H01L 2224/48257* (2013.01); *H01L 2224/73253* (2013.01); *H01L 2924/16195* (2013.01); *H01L 2933/0041* (2013.01)

(58) Field of Classification Search
CPC ................. H01L 33/504; H01L 33/005; H01L 2933/0041
USPC .......................................................... 438/29
See application file for complete search history.

(56) References Cited

U.S. PATENT DOCUMENTS

| | | | |
|---|---|---|---|
| 6,960,878 B2 * | 11/2005 | Sakano | B29C 67/08 257/10 |
| 7,737,621 B2 * | 6/2010 | Masuda | C09K 11/0883 252/301.4 R |
| 7,923,746 B2 * | 4/2011 | Tsai | H01L 33/486 257/99 |
| 8,084,934 B2 * | 12/2011 | Kim | C09K 11/025 313/501 |
| 8,288,937 B2 * | 10/2012 | Ishii | C09K 11/7734 313/503 |
| 8,513,872 B2 * | 8/2013 | Annen | B82Y 30/00 313/483 |

(Continued)

FOREIGN PATENT DOCUMENTS

| | | |
|---|---|---|
| JP | 08-264842 A | 10/1996 |
| JP | 2004-179644 A | 6/2004 |

(Continued)

OTHER PUBLICATIONS

Unpublished U.S. Appl. No. 14/568,256 by Takuya Nakabayashi et al., filed Dec. 12, 2014, entitled Light Emitting Device.

*Primary Examiner* — Xinning Niu
*Assistant Examiner* — Vu A Vu
(74) *Attorney, Agent, or Firm* — Global IP Counselors, LLP

(57) ABSTRACT

A method for manufacturing a light emitting device has: forming a first phosphor layer including a first phosphor that is based on KSF or quantum dots on a light emitting element by a method other than spraying, and forming a second phosphor layer including a second phosphor that is different from the first phosphor on the first phosphor layer by spraying.

19 Claims, 8 Drawing Sheets

(56) References Cited

U.S. PATENT DOCUMENTS

| | | |
|---|---|---|
| 2004/0061433 A1 | 4/2004 | Izuno et al. |
| 2004/0072383 A1 | 4/2004 | Nagahama et al. |
| 2006/0128118 A1 | 6/2006 | Nagahama et al. |
| 2006/0267042 A1 | 11/2006 | Izuno et al. |
| 2008/0231170 A1* | 9/2008 | Masato ................ C09K 11/565 313/501 |
| 2008/0296609 A1 | 12/2008 | Nagahama et al. |
| 2010/0237775 A1 | 9/2010 | Chao |
| 2012/0051075 A1* | 3/2012 | Harada ................ H01L 33/508 362/510 |
| 2013/0264937 A1* | 10/2013 | Sakuta ................ H01L 33/504 313/503 |
| 2013/0288407 A1* | 10/2013 | Lo ........................ H01L 33/52 438/27 |
| 2013/0341666 A1* | 12/2013 | Yoshida ................ H01L 24/97 257/98 |
| 2014/0342480 A1* | 11/2014 | Matsunaga ........... H01L 33/504 438/29 |
| 2015/0021642 A1 | 1/2015 | Nakabayashi |

FOREIGN PATENT DOCUMENTS

| | | |
|---|---|---|
| JP | 2007-221174 A | 8/2007 |
| JP | 2008-205511 A | 9/2008 |
| JP | 2010-226110 A | 10/2010 |
| JP | 2013-012516 A | 1/2013 |
| JP | 2014-107307 A | 6/2014 |
| WO | 03-034508 A1 | 4/2003 |

\* cited by examiner

US 9,660,151 B2

METHOD FOR MANUFACTURING LIGHT EMITTING DEVICE

CROSS-REFERENCE TO RELATED APPLICATIONS

This application claims priority to Japanese Patent Application No. 2014-105331 filed on May 21, 2014. The entire disclosure of Japanese Patent Application No. 2014-105331 is hereby incorporated herein by reference.

BACKGROUND

Technical Field

The present disclosure relates to a method for manufacturing light emitting device.

Related Art

Many different light sources have been used in electronic devices. For instance, there has been proposed a light emitting device in which is used a light emitting diode that is a combination of a light emitting element and a phosphor (JPH08-264842A).

On the other hand, the components that make up light emitting devices have been getting smaller.

Also, the desire to improve performance and diversify the applications of light emitting devices has led to a need for phosphors having many different characteristics.

SUMMARY

The method for manufacturing a light emitting device according to one aspect of the present invention is a method for manufacturing a light emitting device that including: forming a first phosphor layer including a first phosphor that is based on KSF or quantum dots on a light emitting element by a method other than spraying, and forming a second phosphor layer including a second phosphor that is different from the first phosphor on the first phosphor layer by spraying.

DETAILED DESCRIPTION

Figure 1A:
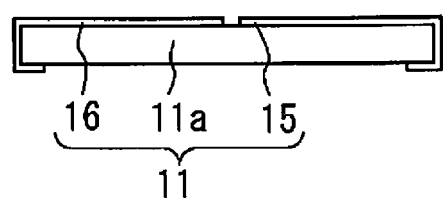
FIGS. 1A to 1G are schematic sectional process views illustrating a method of a light emitting device of an embodiment of the present invention.

Hereinafter, embodiments of the present invention will be described with reference to the drawings as appropriate. It is to be noted that the light emitting device described below is intended for implementing the technical concept of the present invention, and the present invention is not limited to those described below unless otherwise specified. Matters described in one embodiment and example are applicable to other embodiments and examples. The size, positional relationship and so on of members shown in the drawings may be exaggerated for clarifying the descriptions.

A light emitting device, which is manufactured by methods described in the present disclosure, includes at least a light emitting element, and a phosphor layer. In the present disclosure, light emitting devices are so called a side view type light emitting devices in which a surface intersecting a mounting surface (side surface) of the light emitting device is a light extraction surface are mainly described, but the method of the present disclosure can also be applied to so called a top view type light emitting device in which a surface opposite to a light extraction surface is a mounting surface.

In this description, a light extraction surface of the light emitting device is referred to as an upper surface, and a surface neighboring or intersecting the light extraction surface is referred to as a side surface. And when side view type light emitting device is described, one of the side surfaces may be referred to as a mounting surface of the light emitting device. Also, among the surfaces of elements or members that form the light emitting device, a surface corresponding to the light extraction surface of the light emitting device may be referred to as a first main surface or front surface (i.e. upper surface), a surface opposite to the first main surface may be referred to as a second main surface (i.e. lower surface), and a surface neighboring or intersecting the first main surface and the second main surface (i.e. surface corresponding to the side surface of the light emitting device) may be referred to as an end surface.

Method for Manufacturing Light Emitting Device

A method of the present embodiment for manufacturing a light emitting device mainly includes, forming a first phosphor layer including a first phosphor on the light emitting element by a method other than spraying, and forming a second phosphor layer including a second phosphor that is different from the first phosphor on the first phosphor layer by spraying. Also, the method includes, for example, the following steps in addition to the steps of forming the first phosphor layer and the second phosphor layer:

(a) preparing a substrate includes a base material provided with connection terminals that are electrically connected to a light emitting element;

(b) preparing a light emitting element;

(c) mounting the light emitting element on the substrate; and (d) forming a light blocking member, and the like.

A method of the present embodiment for manufacturing a light emitting device can manufacture a compact and slim light emitting device easily with thin phosphor layer. Also, wavelength conversion can be carried out efficiently. Furthermore, a light extraction efficiency of the light emitting device can be improved and various kinds of phosphor can be used.

(a) Preparation of Substrate

First, the substrate used to manufacture the light emitting device may be prepared. The substrate may include a base material, and a pair of connection terminals corresponding to the positive and the negative, on at least the first main surface of the base material.

At least the first main surface as a shape which, for example, preferably includes a lengthwise direction and a short-side direction that intersects or is perpendicular to the lengthwise direction. For example, the base body has a thickness of, for example, a maximum of preferably about 500 μm or less, more preferably about 300 μm or less, further preferably about 200 μm or less. The maximum thickness is preferably about 40 μm or more.

The strength of the substrate can be adjusted according to a material of the base material to be described below, a material of the connection terminal, and the like. For example, within the above-described thickness range, the flexural strength is preferably 300 MPa or more, more preferably 400 MPa or more, further preferably 600 MPa or more. The strength of the light emitting device can be accordingly secured. The flexural strength in the present specification refers to a value measured by using a commercially available strength measuring apparatus, for example, by a three-point flexural test using an Instron machine.

With the substrate of suitable strength as described above, a light emitting device which is small and thin and has high performance and high reliability can be obtained.

Base Material

Examples of the base material include metals, ceramics, resins, dielectric materials, pulp, glass and paper or composite materials thereof (e.g. composite resins), or composite materials of the above-mentioned materials and conductive materials (e.g. metals, carbon etc.). Examples of the metal include copper, iron, nickel, chromium, aluminum, silver, gold and titanium or those including alloys thereof. Examples of the ceramic include aluminum oxide, aluminum nitride, zirconium oxide, zirconium nitride, titanium oxide and titanium nitride or those including mixtures thereof. Examples of the composite resin include glass epoxy resins.

The coefficient of linear expansion of the base material is preferably close to the coefficient of linear expansion of the light emitting element. For example, the difference between the two is preferably about 10 ppm/° C. This reduces the risk that the light emitting element connected to the base will be damaged.

Connection Terminal

A pair of connection terminals may be formed on at least the first main surface of the substrate on which the light emitting element is mounted. In this case, it is preferred that at least a part of the edge of the connection terminal coincides with a part of the edge of the first main surface of the substrate. Accordingly, a mounting board and the end face of the connection terminal can be brought into contact with (or made as closer as possible to) each other in mounting of the light emitting device on the mounting board. As a result, the mountability of the light emitting device can be improved. Here, the coincidence means that there is no or almost no step difference, and means that irregularities of several μm are tolerated. In the description of the present discloser, the same plane has the same meaning hereinafter.

The connection terminal may include an element connection section connected to the electrode of the light emitting element and an external connection section connected to the outside of the light emitting device. The element connection section and the element connection section may be provided on the first main surface of the substrate. It is preferred that the external connection section is provided on the second main surface of the substrate in addition to the first main surface of the substrate. For example, it is preferred that the connection terminal is (i) provided so as to extend from the first main surface onto a surface present between the first main surface and the second main surface, or (ii) provided so as to extend from the first main surface onto the second main surface through a via or a through-hole etc. provided so as to extend through the base material, or (iii) provided so as to extend from the first main surface onto the second main surface and a surface present between the first main surface and the second main surface (e.g. provided in a U-shape in cross-sectional view). Here, the surface present between the first main surface and the second main surface may refer to a part or the whole of one end surface present between the first main surface and the second main surface, or may refer to a part or the whole of two or more end surfaces present between the first main surface and the second main surface. Usually, the element connection section is disposed on the first main surface, and the external connection section is disposed on (i) the first main surface, (ii) the first main surface and the end surface, (iii) the first main surface, the end surface and the second main surface, or (iv) the first main surface and the second main surface.

The substrate may include a heat releasing terminal, a heat sink, a reinforcement member and so on in addition to the connection terminal electrically connected to the light emitting element. They may be disposed on any of the first main surface, the second main surface and the end surface, and in particular, preferably disposed below the light emitting element and/or a light blocking member described below. The strength and reliability of the light emitting device can be accordingly enhanced. By enhancing the strength of the substrate, distortion of the substrate is reduced, so that moldability of the light blocking member can be improved when the light blocking member is molded using a mold.

In the case where the heat releasing terminal or reinforcement terminal is conductive, and is provided between a pair of connection terminals, it is preferred that the heat releasing terminal or reinforcement terminal is covered with an insulating film. Bridging of the bonding member with the connection terminal and the heat releasing terminal or reinforcement terminal can be accordingly prevented.

Further, in the case where a plurality of light emitting elements are disposed in one light emitting device, the light emitting device may include one or more additional connection terminals for electrically connecting the plurality of light emitting elements. The shape, position and the like of the connection terminal can be appropriately set according to the number of light emitting elements mounted on one substrate, and the arrangement and circuit configuration such as parallel and series thereof, etc.

The connection terminal can be formed from, for example, a single-layer film or laminated film of Au, Pt, Pd, Rh, Ni, W, Mo, Cr, Ti, Fe, Cu, Al, Ag or an alloy thereof. Among those, one good in conductivity and mountability is preferred, and a material having good bondability and wettability with the bonding member on the mounting side such as a mounting board is more preferred. Particularly, copper or a copper alloy is preferred from the viewpoint of heat releasability. A film having a high light reflectivity, such as a single-layer film or laminated film of silver, platinum, tin, gold, copper, rhodium or an alloy thereof may be formed on the surface of the connection terminal. Specific examples of the structure of the connection terminal include laminated structures such as W/Ni/Au, W/Ni/Pd/Au, W/NiCo/Pd/Au, Cu/Ni/Cu/Ni/Pd/Au, Cu/Ni/Pd/Au, Cu/Ni/Au, Cu/Ni/Ag and Cu/Ni/Au/Ag. The thickness or the number of layers may partially vary.

The connection terminal may be in the form of a thin-film formed on the base material by plating or the like, or may be a lead frame obtained by forming sheet metal.

The substrate may itself form a protective element such as a capacitor, a varistor, a zener diode or a bridge diode. Also, the substrate may include a structure, which performs the function of these elements, as a part thereof in the form of, for example, a multilayer structure or a laminated structure as long as the linear expansion coefficient of the base material is damaged significantly. By using one that performs the above-mentioned element function, the substrate can be made to function as a light emitting device without additionally carrying components. As a result, a high-performance light emitting device having improved electrostatic withstand voltage can be made smaller.

In another embodiment, the substrate may be one that includes a base material having a recess, and a pair of connection terminals that are exposed at the bottom of the recess and protrude from the side surfaces of the base material. In this case, the side walls of the recess are preferably formed from a material that blocks light. This light blocking material can be suitably selected from among the light blocking materials listed as examples below.

In yet another embodiment, the substrate may have a lead frame having a recess that houses a light emitting element and that is obtained by bending or pressing sheet metal, for example, and a base material in which part of this lead frame is embedded. A layer of material having high reflectivity, such as silver, is preferably provided to the surface of the lead frame.

(b) Preparation of Light Emitting Element

The light emitting element includes at least a semiconductor laminate. The semiconductor laminate may formed by laminating a first semiconductor layer (e.g. n-type semiconductor layer), a light emitting layer and a second semiconductor layer (e.g. p-type semiconductor layer) in this order, and contributes to light emission. The thickness of the semiconductor laminate is preferably about 30 µm or less, more preferably about 15 µM or less or about 10 µm or less.

The light emitting element may have a substrate that supports a semiconductor laminate. In the case where a light emitting element that has the substrate is mounted in flip-chip manner, the substrate of the light emitting element is disposed on the upper side of the light emitting device. The substrate is generally sturdier than the semiconductor laminate, and even if it suffers some damage, this will tend not to affect the reliability of the light emitting device. Therefore, as discussed below, when a recess is formed in the upper part of the light emitting element by a method that poses the risk of subjecting the light emitting element to a physical or chemical load, such as blasting or photolithography, the light emitting element is preferably mounted in flip-chip manner.

The semiconductor laminate may be laminated on a growth substrate of a semiconductor layer. Examples of the growth substrate of the semiconductor layer include those capable of epitaxial growth a semiconductor layer. Examples of the material of the growth substrate include insulating substrates such as those of sapphire ($Al_2O_3$) and spinel ($MgAl_2O_4$), and a nitride-based semiconductor substrates. The thickness of the substrate is preferably about 190 µm or less, more preferably about 180 µm or less or about 150 µm or less.

The substrate may have an off angle of about 0 to 10° with respect to a predetermined crystal plane such as the C plane or the A plane. The substrate may have a semiconductor layer, an insulating layer or the like as an intermediate layer, a buffer layer, an under-layer or the like between the substrate and the first semiconductor layer.

The substrate may have a plurality of projection portions or irregularities on a surface thereof. The height may be about 0.5 to 2.0 µm, and the pitch may be about 10 to 25 µm.

The growth substrate of a semiconductor layer can be used for the light emitting device without being removed from the semiconductor laminate in the case where a growth substrate having light transmissivity, such as a sapphire is used. Alternatively, such the growth substrate may be removed from the semiconductor laminate. The growth substrate can be removed using a laser lift-off method etc. The growth substrate completely may remove from the semiconductor layer and the growth substrate may slightly remain, for example at the end or the corner of the semiconductor layer. The growth substrate can be removed before or after the light emitting element is mounted on the substrate.

In the case where the semiconductor laminate is freed of the growth substrate of a semiconductor layer, a light emitting device that is thinner and smaller can be obtained. By removing a layer that does not directly contribute to light emission, absorption of light emitted from the light emitting layer, which is caused by the above-mentioned layer, can be reduced. Further, scattering of light caused by the substrate can be reduced. Accordingly, luminous efficiency can be further improved. As a result, the luminance can be enhanced.

The light emitting element may have structure known as so called vertical dice or laminated dice, for example a laminated structure as described in JP 2008-300719 A or JP 2009-10280.

The shape of the light emitting element in plan view is preferably a quadrangle or a shape very close thereto. Among those, a rectangular shape (particularly, an elongated rectangular shape) is more preferable. The upper limit of the size of light emitting elements can be appropriately adjusted according to a size of the light emitting device. The length of one side of the light emitting element is, for example, about hundred µm to 2 mm, and the size is preferably about 1400×200 µm, about 1100×200 µm or about 900×200 µm. In case where light emitting device is a side view type, the shape of the light emitting element in plan view is preferably rectangular, with a ratio of about 1:3 to 1:20 between the lengthwise direction and the short-side direction.

First Electrode and Second Electrode

The light emitting element may have positive and negative electrodes on the same side, or may have the positive electrode on the upper side and the negative electrode on the lower side of the base material, but preferably has both a first electrode (positive or negative) that is electrically connected to the first semiconductor layer, and a second electrode (negative or positive) that is electrically connected to the second semiconductor layer, on the same side of a semiconductor laminate.

Preferably, the first electrode and the second electrode are formed on the same surface (surface opposite to the substrate in the presence of the substrate of the light emitting element) of the semiconductor laminate. Accordingly, flip-chip mounting can be performed in which the positive and negative connection terminals of the substrate face to the first electrode and the second electrode of the light emitting element.

The first electrode and the second electrode may include an ohmic electrode, a metal film, outer connection electrode and the like.

(c) Mounting of Light Emitting Element

The light emitting element may be mounted on the substrate, and connected to the connection terminal on the first main surface at the first main surface of the substrate.

One light emitting element, or a plurality of light emitting elements may be mounted on one light emitting device. The size, shape and light emitting wavelength of the light emitting element can be appropriately selected. In the case where a plurality of light emitting elements are mounted, they may be disposed irregularly, or may be disposed regularly in the form of a matrix or the like, or periodically. A plurality of light emitting elements may be connected in any form of series connection, parallel connection, series-parallel connection or parallel-series connection.

The light emitting element is preferably flip-chip mounted on the substrate. This allows a light emitting device to be manufactured without using conductive wires or other such members, and allows a smaller, thinner light emitting device to be obtained.

In the case where the light emitting element is flip-chip-mounted on the substrate, the first electrode and the second electrode are bonded to the connection terminals of the above-described substrate by a bonding member. For the bonding member, any of the materials known in the art can be used, and examples include conductive bonding members. Specific examples include tin-bismuth-based solder, tin-copper-based solder, tin-silver-based solder, gold-silver-based solder and the like (specifically, alloys having Ag, Cu and Sn as main components, alloys having Cu and Sn as main components, alloys having Bi and Sn as main components, and the like), eutectic alloys (alloys having Au and Sn as main components, alloys having Au and Si as main components, alloys having Au and Ge as main components, and the like), conductive pastes of silver, gold, palladium and the like, bumps, anisotropic conductive materials, and brazing materials such as low-melting-point metals. With the use of a solder, along with the shape of the above-described connection terminal, a high-accuracy self-alignment effect can be exhibited. Accordingly, the light emitting element is easily mounted in the right place, so that mass productivity can be improved, and smaller light emitting devices can be produced.

Also, in the case where the light emitting element is mounted so that the semiconductor layer is facing the light extraction side of the light emitting device and the substrate is facing the first main surface of the base (that is, face up), the first electrode and/or the second electrode may be connected to the connection terminal with a conductive wire of gold or the like.

(d) Formation of Light Blocking Member

In an embodiment, first a light blocking member can be formed such that it is in contact with the flip-chip mounted light emitting element and embeds the light emitting element. That is, it is disposed so as to directly cover the top face from the side surface of the light emitting element.

Examples of the material of light blocking member include ceramics, resins, dielectric materials, pulp, glass and composite materials thereof. Among those, resins are preferred because they can be easily molded into any shape.

Examples of the resin can be used for the light blocking member include thermosetting resins, thermoplastic resins, modified resins thereof and hybrid resins at least one of these resins. Specific examples include resins such as epoxy resin compositions, modified epoxy resin compositions (silicone-modified epoxy resins etc.), silicone resin compositions, modified silicone resin compositions (epoxy-modified silicone resins etc.), hybrid silicone resins, polyimide resin compositions, modified polyimide resin compositions, polyamide resins, polyethylene terephthalate resins, polybutylene terephthalate resins, polycyclohexane terephthalate resins, polyphthalamide (PPA), polycarbonate resins, polyphenylene sulfide (PPS), liquid crystal polymers (LCP), ABS resins, phenol resins, acrylic resins, PBT resins, urea resins, BT resins and polyurethane resins.

The linear expansion coefficient and the glass transition temperature etc. of the resin used in the light blocking member are not particularly limited, however, the linear expansion coefficient is preferably about 100 ppm/° C. or less, more preferably about 80 ppm/° C. or less or about 60 ppm/° C. or less, and the glass transition temperature is preferably about 100° C. or lower, more preferably about 75° C. or lower or 50° C. or lower.

It is preferred that the above-described material, e.g. a resin contains, for example, a light reflection material, a light scattering material, a colorant and the like such as titanium dioxide, silicon dioxide, zirconium dioxide, potassium titanate, alumina, aluminum nitride, boron nitride, mullite, niobium oxide, zinc oxide, barium sulfate, carbon black and various kinds of rare earth oxides (e.g. yttrium oxide and gadolinium oxide). Specifically, the above-described resin itself may be light transmissive, but it can preferably include a light shielding material having a reflectivity of 60% or more, 70% or more, 80% or more or 90% or more to light from the light emitting element.

The light blocking member may contain a fibrous filler such as glass fibers or wollastonite, or an inorganic filler such as carbon. The light blocking member may contain a material having high heat releasability (e.g. aluminum nitride etc.). Preferably, the light blocking member contains these additives in an amount of, for example, about 10 to 95% by weight, 20 to 80% by weight or 30 to 60% by weight based on the total weight of the light blocking member.

In the case where the light blocking member contains a light reflection material, light from the light emitting element can be efficiently reflected. Particularly, by using a material having a light reflectivity higher than that of the substrate (for example, by using a silicone resin containing titanium dioxide as a light blocking member in the case where aluminum nitride is used for the substrate), light extraction efficiency of the light emitting device can be enhanced by reducing light extraction efficiency of the light emitting device can be enhanced by reducing the size of the substrate while handling characteristics are retained. substrate. In the case where the light blocking member contains only titanium dioxide as a light reflection material, it contains the light reflection material in an amount of preferably about 20 to 60% by weight, more preferably 30 to 50% by weight based on the total weight of the light blocking member.

In the case where the light emitting device has a light blocking member, the strength of the light emitting device during processes such as removal or peeling of a growth substrate or a support of the semiconductor layer can be improved. Further, the strength of the whole light emitting device can be secured. By forming the light blocking member from a material having high heat releasability, heat releasability can be improved while the light emitting device is kept small.

The light blocking member can be formed by screen printing, potting, transfer molding, a compression molding or the like. In the case where a molding machine is used, a mold release film may be used.

The light blocking member may be formed to a height at which its upper surface coincides with the upper surface of the light emitting element, or may be formed to a height that will cover the light emitting element. In the latter case, part of the upper surface of the light blocking member is preferably removed to expose the upper surface of the light emitting element. Here, the light blocking member may be removed so that the upper surface of the light emitting element matches up with the upper surface of the light blocking member, or just part of the light blocking member may be selectively removed (that is, in the form of a recess) so that the recess is disposed above the light emitting element. Selective removal can be accomplished by blasting, etching, or the like with a mask. The recess formed in this way can have substantially the same shape as the light emitting element in plan view. The depth, for example, can be 200 μm or less, 150 μm or less, or 100 μm or less, with 50 μm or less being preferable. The side surfaces of the recess may be sloped so that they widen toward the light extraction face of the light emitting device, or they may be substantially vertical.

The depth and other dimensions of the recess are suitably selected as dictated by the characteristics of the light emitting device to be manufactured, the shape of the phosphor layer formed in the recess, the properties of the material that forms the phosphor layer, and so forth.

The recess may be formed by using a substrate formed in the shape of a recess by compression molding, transfer molding, injection molding, or the like, in addition to the method discussed above in which the light blocking member in which the light emitting element is embedded is selectively removed.

The recess can also be formed by using the light blocking member to cover the side surfaces of the flip-chip mounted light emitting element having the growth substrate, and then removing the growth substrate. With this method, it is possible to form an extremely small recess in substantially the same shape (in plan view) as the light emitting element (the semiconductor laminate).

Furthermore, the recess may be formed by first forming a resist around the light emitting element (and particularly on the light extraction face side of the light emitting device), disposing a light blocking member around the light emitting element, and then removing the resist.

The light blocking member may be formed afterward, separately from the substrate or the base material, or it may be formed integrally with the substrate or the base material or both, or it may be bonded to the substrate or the base material.

Formation of First Phosphor Layer and Second Phosphor Layer

The first phosphor layer is formed on at least the light emitting element, that is, on the light extraction face of the light emitting device. The second phosphor layer is formed by spraying on the first phosphor layer thus obtained. If the recess (produced by the light blocking member) is disposed above the light emitting element, the first phosphor layer is preferably formed inside the recess. The second phosphor layer may also be formed inside the recess.

The first phosphor layer and the second phosphor layer may each be a layer that includes only a phosphor, or may contain a phosphor and a light transmissive material (such as a resin) as a binder. Optionally, it may contain a filler, a light diffusing material, a colorant, or another such additive.

The first phosphor and the second phosphor may emit light with mutually different wavelengths when excited by light emitted from at least the light emitting element. Examples include, (i) garnet-based phosphors such as aluminum-garnet-based phosphors, e.g., yttrium-aluminum-garnet (YAG)-based phosphors activated by cerium, lutetium-aluminum-garnet (LAG)-based phosphors activated by cerium, (ii) nitrogen-containing calcium aluminosilicate ($CaO$—$Al_2O_3$—$SiO_2$)-based phosphors activated by europium and/or chromium, (iii) silicate (($Sr$, $Ba$)$_2SiO_4$)-based phosphors activated by europium, (iv) β-SiiAlon phosphors, (v) nitride-based phosphors such as CASN-based ($CaAlSiN_2$:Eu) or SCASN-based phosphors, (vi) rare earth nitride phosphors such as $LnSi_3N_{11}$-based phosphors, LnSiAlON-based phosphors (Ln is a rare earth element), (vii) oxynitride-based phosphors such as $BaSi_2O_2N_2$:Eu-based phosphors, $Ba_3Si_6O_{12}N_2$:Eu-based phosphors, (viii) KSF-based phosphors ($K_2SiF_6$:Mn), (ix) sulfide-based phosphors such as CaS-based phosphors (CaS:Eu), $SrGa_2S_4$-based phosphors ($SrGa_2S_4$:Eu), $SrAl_2O_4$-based phosphors, ZnS-based phosphors, (x) chloro-silicate-based phosphors, and the like.

Examples of the phosphor include a luminescent material referred to as a so called nanocrystal or quantum dot, which is nano-size high-dispersive particles of semiconductor materials, for example group II-VI, group III-V and group IV-VI semiconductors, more specifically CdSe, core-shell type $CdS_xSe_{1-x}$/ZnS, GaP, InP, and GaAs. The quantum dot phosphor may be unstable, and therefore may be surface-covered or stabilized with a resin such as PMMA (polymethyl methacrylate), a silicone resin, an epoxy resin, a hybrid resin of these, and the like.

Accordingly, there can be provided a light emitting device that emits mixed-color light (e.g. white light) of primary light having a visible wavelength and secondary light that is excited by primary light having a visible wavelength, and a light emitting device that is excited by primary light of ultraviolet light to emit secondary light having a visible wavelength. In the case where the light emitting device is used for a backlight of a liquid crystal display or the like, it is preferred to use a phosphor that is excited by blue light to emit red light (e.g. KSF-based phosphor) and a phosphor that emits green light (e.g. β-SiAlON phosphor). The color reproduction range of a display including such light emitting device can be accordingly broadened. In the case where the light emitting device is used for illumination or the like, a light emitting element that emits blue light can be used in combination with a yellow phosphor, a red phosphor, and a light emitting element that emits bluish-green light or blue-green phosphor.

The light transmissive material can be suitably selected from among the above-mentioned resin and so forth can be used for the light blocking member. The fillers, light diffusing materials, colorants, and other such additives can be suitably selected from among the additives listed as examples of the base material, the light blocking member, etc.

The light transmissive material used for the second phosphor layer is preferably a material whose gas barrier property and water vapor permeability are higher than those of the first phosphor layer. This effectively protects the first phosphor in the first phosphor layer. The transmissive material using the first phosphor layer is preferably one with high thermal conductivity and better heat dissipation than that of the second phosphor layer. This enhances the reliability of the light emitting device. The refractive index of the light transmissive material using the first phosphor layer is preferably equal to or higher than that of the light transmissive material using the second phosphor layer. This allows light to be effectively extracted from the phosphor layer and enhances the light extraction efficiency of the light emitting device. The amount of the phosphor and/or the filler is, for example, preferably about 10 to 80% by weight based on the total weight of the first phosphor layer and the second phosphor layer, respectively.

The second phosphor contained in the second phosphor layer preferably has better weather resistance, and in particular higher water resistance, has a shorter emission wavelength, is more resistant to degradation, and higher hardness than the first phosphor contained in the first phosphor layer. The reason for this is to protect the first phosphor and suppress degradation and so forth of the first phosphor. This allows the functions of the first phosphor to be realized. As a result, a light emitting device with high reliability and a long service life can be manufactured.

In this Specification, the emission wavelength of the phosphor refers to the peak wavelength. In general, at a given excitation wavelength, the longer is the emission wavelength of a phosphor, the more heat will be generated in wavelength conversion. Accordingly, in the case where the emission wavelength of the second phosphor is shorter than the emission wavelength of the first phosphor, that is, in the case where the emission wavelength of the first phosphor is longer than the emission wavelength of the second phosphor, more heat will tend to be generated from the first phosphor, but heat dissipation from the first phosphor can be improved by disposing the first phosphor layer at a position near the substrate, the light emitting element or other members.

Water resistance means resistance to a phenomenon whereby water or moisture causes the base material of the phosphor to dissolve, decompose, deliquesce, chemically react, etc., and thereby change from the state of the original compound, which alters the physical properties of the phosphor. Thus, high water resistance refers to little change in the physical properties of the phosphor.

The first phosphor or the second phosphor is preferably a phosphor in the form of particles. These particles may be in a crushed form, a spherical form, hollow, porous, etc. For example, the phosphor is preferably one having an average particle size (median diameter) of 50 µm or less, 30 µm or less, or 10 µm or less. The average particle size can be measured and calculated using a commercially available particle measurement device, a particle size distribution measurement device, or the like. The above-mentioned particle size refers to a particle size obtained by an air permeability method in F.S.S.S.No (Fisher Sub Sieve Sizer's No).

In particular, since the first phosphor is formed as a phosphor layer by a method other than spraying, it can have an average particle size that is larger than the average particle size of the second phosphor.

The above-mentioned phosphors, such as nanocrystals or quantum dots, have a particle size of about 1 to 100 nm (10 to 50 atoms). By using such a phosphor, internal scattering can be suppressed, so that light transmittance can be improved. By suppressing internal scattering, light components distributed in a direction perpendicular to the upper surface can be increased, and simultaneously light directed toward the side surface or the lower surface of the light emitting device can be suppressed, so that light extraction efficiency can be improved. For example, in the case where the light emitting device is applied to a backlight, efficiency of entrance of light to the backlight can be enhanced. These phosphors called nanocrystals or quantum dots are generally readily degraded by the external environment of the light emitting device (such as moisture or gas), which makes them favorable for use as the first phosphor.

The first phosphor is preferably at least one selected from the group consisting of a material based on KSF, CaS, $SrGa_2S_4$, $SrAl_2O_4$, CASN or quantum dots. The second phosphor is preferably at least one selected from the group consisting of a material based on garnet, and in particular aluminum garnet, β-SiAlON, or chlorosilicate.

The average particle size of the first phosphor is about 50 µm or less, the average particle size of the second phosphor is about 30 µm or less, and the average particle size of the first phosphor is larger than the average particle size of the second phosphor, in other words, a combination in which the average particle size of the second phosphor is smaller than the average particle size of the first phosphor is preferable. This reduces how much of the secondary light emitted from the first phosphor is blocked by the second phosphor.

The first phosphor layer is formed on the light emitting element by a method other than spraying. As a result, the phosphor is subjected to less stress during manufacture than when formed by spraying. Accordingly, even if the first phosphor is a phosphor with low energy absorption (low mechanical strength or low hardness), the first phosphor layer can be reliably formed at the desired place with proper shape or characteristics of the phosphor. Also, a phosphor with a large particle size, which is difficult to form by spraying can be used. Furthermore, a relatively large quantity of phosphor, which is difficult to form by spraying, can be easily (in a short time, for example) provided.

Examples of methods for forming the first phosphor layer include potting; a method in which a phosphor is applied by electrophoretic deposition and then impregnated with a light transmissive material; molding (such as compression molding); electrostatic coating; printing; and a method in which a sheet of first phosphor is affixed. In the case where the material from which the first phosphor layer is formed is in the form of a liquid, as with potting, compression molding, printing, and the like, a viscosity adjuster (such as microparticles of silica) or the like may be added to adjust the viscosity or flowability. It is particularly favorable to form the layer by potting in which a slurry is supplied that contains a phosphor in a light transmissive resin. Using potting allows the first phosphor layer to be formed simply, with little stress on the first phosphor.

In the case where the first phosphor layer is formed along with a light transmissive material (binder) by potting or the like, it is preferably formed so that the concentration of the first phosphor is higher at a position near the light emitting element in the thickness direction of the first phosphor layer. Accordingly, it is preferable to adjust the viscosity of the light transmissive material after taking the particle size of the first phosphor into account. This allows the light emitted from the light emitting element to be shined directly at the first phosphor, which increases the wavelength conversion efficiency and prevents color unevenness and so forth. Also, since the distance between the first phosphor and the surface of the light emitting device can be increased, the external environment (moisture, gases, ultraviolet rays, oxygen, etc.)

will have less effect on the first phosphor. Furthermore, the heat generated from the phosphor in wavelength conversion can be effectively dissipated by moving the first phosphor closer to the substrate, the light blocking member, the light emitting element, or other such parts of the light emitting device.

This first phosphor layer can be formed, for example, by a method in which the material that forms the first phosphor layer is potted, after which the first phosphor is allowed to stand or is subjected to centrifugal force until it settles.

The first phosphor layer is preferably formed inside the recess of the light blocking member, etc. This allows the layer to be easily formed by potting. Also, it can be easier to control the thickness, shape, and so forth of the first phosphor layer, and a light emitting device can be manufactured stably.

The first phosphor layer is preferably provided so as not to be in contact with the external environment (not be exposed to the outside of the light emitting device). This protects the first phosphor and enhances the reliability of the light emitting device. For example, it is preferable in the case where the first phosphor layer is covered from its upper surface to its side surfaces with the second phosphor layer or another material, or in the case where the first phosphor layer is provided inside the recess and the side surfaces of the first phosphor layer are covered by the inner wall faces of the recess.

The concentration in which the phosphor is contained in the first phosphor layer is preferably less than the concentration in which the phosphor is contained in the second phosphor layer. This reduces the absorption of primary or secondary light by the first phosphor disposed at a position closer to the light emitting element.

The thickness of the first phosphor layer is preferably 200 μm or less, and more preferably 100 μm or less. The thickness of the first phosphor layer is more preferably more than the thickness of the second phosphor layer.

As discussed above, in the case where the side surfaces of the light emitting element are covered by the light blocking member, the first phosphor layer may be formed on just the upper surface of the light emitting element, or may be formed on the upper surfaces of both the light emitting element and the light blocking member. Also, in the case where the light blocking member has a recess above the light emitting element, the first phosphor layer may be formed on the inside of the recess and the outside of the recess (the outer periphery of the recess, but is preferably formed only on the light emitting element exposed in the recess of the light blocking member. In this case, it is preferably formed so that all or part of the side surfaces of the first phosphor layer are covered by the inner walls of the recess of the light blocking member. In the case where the side surfaces of the first phosphor layer are covered by the light blocking member, the first phosphor layer or the first phosphor will not be exposed on the outside of the light emitting device, and this improves the reliability of the light emitting device.

The second phosphor layer is formed by spraying on the first phosphor layer. This spraying can be either dry or wet. It is particularly preferable for the spraying to be done in pulses, that is, to use a pulse spraying method in which the material is sprayed out intermittently. A pulse sprayer can be utilized for this purpose.

Figure 7:
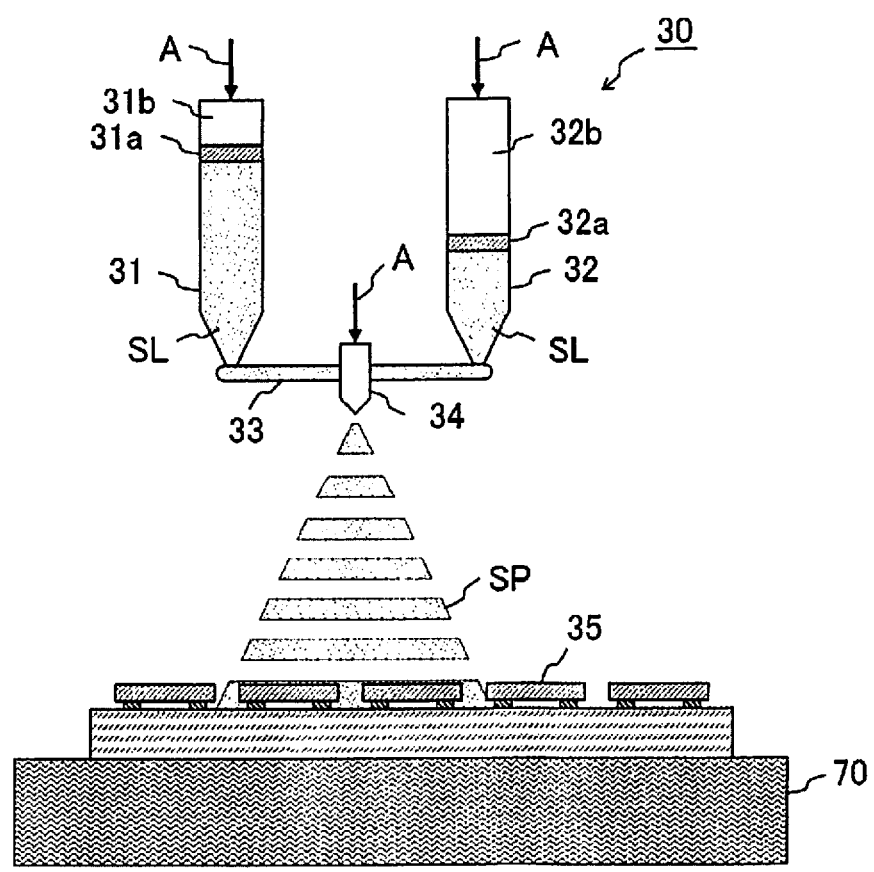
FIG. 7 is a simplified diagram illustrating pulse spraying in which a pulse sprayer is used.

As shown in FIG. 7, a pulse sprayer 30 in this embodiment mainly includes syringes 31 and 32 that hold a slurry SL, a tube 33 that connects the syringes 31 and 32 together, and a spray nozzle 34 that sprays out the slurry SL.

The slurry SL, which is a mixture of a solvent, a resin, and particles of a phosphor, is held inside the syringes 31 and 32. The syringes 31 and 32 are connected to an air compressor (not shown) for supplying air, and this keeps compressed gases 31b and 32b at a specific pressure inside the syringes 31 and 32.

Also, plungers 31a and 32a are provided inside the syringes 31 and 32, between the slurry SL and the compressed gases 31b and 32b. The plungers 31a and 32a keep the slurry SL separate from the compressed gases 31b and 32b, so dissolution of the compressed gases 31b and 32b in the slurry SL can be reduced.

The tube 33 as a fluid channel is connected to the spray nozzle 34. The spray nozzle 34 is also connected to an air compressor for supplying air. The angle of the spray nozzle 34 is adjustable, allowing the nozzle to be angled with respect to a holder 70.

In spraying, first the discharge valve of the spray nozzle 34 is shut off, and then air is supplied at a predetermined pressure from the air compressor to the syringe 31. This air supply pressurizes the slurry SL contained in the syringe 31, and pumps it through the tube 33 (flow path) toward the syringe 32. After this, when air is similarly supplied at a predetermined pressure to the syringe 32, the slurry SL contained in the syringe 32 is pressurized and is pumped through the tube 33 (flow path) toward the syringe 31. This process is repeated to agitate the slurry SL as it moves between the syringes 31 and 32. This helps keep particles with a high specific gravity from settling, and holds the particles in a state of being dispersed in the slurry SL.

When the slurry SL is applied, the discharge valve of the spray nozzle 34 is opened, and air is intermittently supplied at a predetermined pressure from the air compressor to the spray nozzle 34. While the air is being supplied, the slurry SL can be intermittently discharged by opening a valve provided between the air compressor and the spray nozzle 34. This causes the slurry SL to be intermittently sprayed out along with air from the tip of the spray nozzle 34, and sprayed (labeled SP in the drawing) onto the light emitting element 10.

More specifically, to form the second phosphor layer, first a slurry is prepared. The slurry may contain a solvent, a thermosetting resin, and second phosphor particles. The thermosetting resin is preferably a silicone resin, epoxy resin, urea resin, or the like that is light transmissive and has good light resistance, for example. A phenylsilicone or epoxy resin which has a high gas barrier property is especially preferable in terms of protecting the first phosphor layer. The solvent can be n-hexane, h-heptane, toluene, acetone, isopropyl alcohol, or another such organic solvent. The phosphor is preferably used in an amount of 10 to 80 wt %, for example. The slurry is preferably adjusted to about 0.01 to 1000 mPa·s, with 0.1 to 100 mPa·s being even better. More specifically, the slurry can be one in which the second phosphor, a silicone resin, and n-heptane are mixed in a weight ratio of (2 to 40):(5 to 20):(10 to 200). Mixing in this ratio makes the slurry easier to spray and allows the phosphor to adhere uniformly to the light emitting element. This mixing ratio can also be used to advantage in spraying methods other than pulse spraying.

Next, the slurry thus obtained is put into syringes 31 and 32 of a pulse sprayer 30. The slurry is stirred by being moved between the syringes 31 and 32, and is then applied by pulse spraying. The slurry is applied while moving a spray nozzle 34 so that the slurry can be applied as evenly as possible to the first phosphor layer.

After the slurry has been applied, the resin is allowed to preliminary-cure to form the second phosphor layer.

This layer is coated with slurry by the same method, and the resin is allowed to preliminary-cure to form another second phosphor layer. This is repeated to laminate second phosphor layers up to the thickness at which the desired emission color will be obtained.

In the case where this spraying method is utilized, the second phosphor layer can be formed so that the concentration in which the second phosphor is contained in the second phosphor layer is substantially uniform.

Also, intermittently spraying the second phosphor layer reduces the amount of light transmissive material that is sprayed per unit of time. Accordingly, the slurry can move through the spray nozzle at low speed while being sprayed in a smaller quantity. As a result, the phosphor can be applied uniformly even to a coating surface that is not smooth.

Pulse spraying allows the air speed to be lowered without lowering the spraying velocity of the slurry from the nozzle. Therefore, the slurry can be supplied properly to the coating surface, and the applied slurry is not disturbed by air flow. As a result, a coating film can be formed in which there is good adhesion between the particles of phosphor and the surface of the first phosphor layer.

In particular, in the case where the second phosphor layer is formed by spraying on the first phosphor layer, it will be possible to adjust the color of the light emitted from these phosphor layers by adjusting the type, amount, and so forth of the phosphor in the second phosphor layer.

The thickness of the second phosphor layer is preferably 100 µm or less overall, for example, and more preferably 50 µm or less, or 20 µm or less. The thickness of the second phosphor layer is more preferably less than the thickness of the first phosphor layer.

Using such a thin layer allows light to be extracted in just one main direction from the extraction face and the light emitted from the light emitting element coming out of the side surfaces of the second phosphor layer can be reduced, regardless of whether or not the layer is covered by a light blocking member. Thus, the light extraction efficiency can be improved.

Particularly, in backlight applications, a phosphor layer having a relatively small thickness as described above can further enhance luminous efficiency of the light emitting element and luminous efficiency of the backlight. For example, as described above, the ratio of side surface light to front surface light can be reduced, so that efficiency of entrance of light to a light guide plate of the backlight can be enhanced.

Further, in the case where the second phosphor layer is formed by splaying, the resin amount can be decreased, and therefore the ratio of a 1 resin having a relatively low heat emissivity can be reduced, so that heat accumulation can be reduced. At the same time, the contact area between the light emitting element and the phosphor or between phosphors can be increased, and a heat transfer path can be secured. Accordingly, heat releasability of the second phosphor layer can be improved to improve luminous efficiency. Further, the distance between the surface of the light emitting element and the entrance of light to a light guide plate can be minimized, and therefore light can be made to enter the light guide plate with a higher luminance, so that luminous efficiency in the backlight can be enhanced.

The second phosphor layer preferably has a laminated structure in which a plurality of layers are laminated. In this case, the type and amount of phosphor being used, the type or refractive index of the translucent member, and so forth may vary from layer to layer.

In the case where a phosphor in the form of tiny particles is used, the second phosphor layer can be a thin-film particle layer produced by the above-mentioned spraying method. The thickness precision can be improved by controlling the number of layers. Also, the desired phosphor thickness can be ensured by laminating a plurality of thin-film particle layers. Further, uneven distribution of the phosphor can be suppressed, light that has uniform wavelength conversion can be emitted from the second phosphor layer, and color unevenness and the like can be avoided in the light emitting device.

A thinner light emitting device can be obtained in the case where the second phosphor layer is in contact with the first phosphor layer.

The side surface of the second phosphor layer may be located on the light blocking member, or may coincide with the outer edge of the light emitting element. Also, the side surface of the second phosphor layer may be disposed coinciding with the outer edge of the light emitting element so as to cover the upper surface of the light blocking member. With this configuration, there is no need to use a mask or the like to restrict the shape of the second phosphor layer in forming the second phosphor layer by spraying.

As discussed above, disposing the second phosphor layer over the first phosphor layer allows the fragile first phosphor layer to be protected by the second phosphor layer, and gives a more reliable light emitting device.

As long as the second phosphor layer is formed on the first phosphor layer, other layers may be provided between the first phosphor layer and the second phosphor layer, or on the second phosphor layer, such as interposing or laminating a glass or other light transmissive member, another phosphor layer, or the like. For instance, since glass is a material with lower moisture permeability than the second phosphor layer, the reliability of the light emitting device can be further enhanced by covering the first phosphor layer with such a material with low moisture permeability. The light transmissive member may contain a phosphor and/or a diffusion material, for example.

The upper surface (light extraction face) of the first phosphor layer and/or the second phosphor layer may be flat, or the face that touches this upper surface (light extraction face) and/or the light emitting element may be textured with bumps, recesses, or the like in order to control light distribution. Changing the shape of these may be effective in improving light extraction. The adhesion of the first phosphor layer and/or the second phosphor layer can also be improved.

The first phosphor layer is preferably thicker at the ends and thinner in the middle.

The surface of the second phosphor layer preferably has texturing that originates in or conforms to the shape of the second phosphor (such as the shape of the particles). This improves the efficiency of light extraction from the surface of the second phosphor layer.

Optionally, a light transmissive layer may be provided between the light emitting element and the first phosphor layer, and between the first phosphor layer and the second phosphor layer. Examples of the material of this translucent layer include the material used as the above-mentioned binder, air, and so forth.

Hereinafter, embodiments of the method for manufacturing the light emitting device of the present invention will be described with reference to the drawings.

Embodiment 1: Method for Manufacturing Light Emitting Device

The method for manufacturing a light emitting device in this embodiment includes the following steps.

(a) Preparing a substrate including a base material provided with connection terminals that are electrically connected to a light emitting element (FIG. 1A).

(b) Preparing a light emitting element.

Figure 1B:
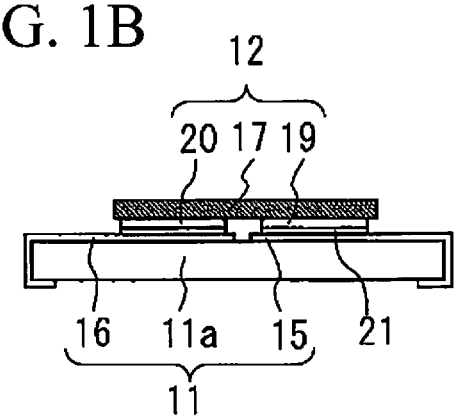

(c) Mounting the light emitting element on the substrate (FIG. 1B).

Figure 1C:
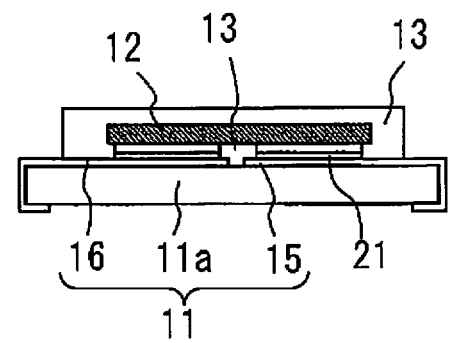

(d) Forming a light blocking member (FIG. 1C).

(a) Preparing a Substrate

As shown in FIG. 1A, a substrate 11 includes a substantially cuboid base material 11a composed of glass epoxy, and a pair of connection terminals 15 and 16 that go from one side of the base material, around the side surfaces, and extend to the other side. The size of the substrate is 3.2 mm×0.4 mm, and the thickness is 0.2 mm.

(b) Preparing a Light Emitting Element

The light emitting element includes a semiconductor laminate 17 including an n-type semiconductor layer, a light emitting layer, and a p-type semiconductor layer laminated on a sapphire substrate, a first electrode 19 connected to the n-type semiconductor layer of the semiconductor laminate 17, and a second electrode 20 connected to the p-type semiconductor layer (see FIG. 1B). A part of the first electrode 19 extends over a portion of the second semiconductor laminate via an insulating film (such as $SiO_2$). The first electrode 19 and the second electrode 20 are such that their faces that are joined to the connection terminals of the substrate 11 have substantially the same surface area and lie in substantially the same plane.

The light emitting element can be manufactured by a method that is known in this field.

(c) Mounting of Light Emitting Element

As shown in FIG. 1B, the first electrode 19 and the second electrode 20 of the light emitting element are joined to the pair of connection terminals 15 and 16 of the substrate 11 respectively with eutectic solder (Au—Sn) so that the main surface of the substrate and the light extraction face of a light emitting element 12 are substantially parallel. The joining can be performed under conditions that are known in this field.

(d) Forming a Light Blocking Member

As shown in FIG. 1C, a light blocking member 13 is formed by compression molding, for example, so as to cover the upper surface and the entire side surfaces of the light emitting element 12. The light blocking member 13 is also disposed between the light emitting element 12 and the substrate 11. The light blocking member 13 includes a silicone resin and titanium dioxide (45 wt %).

Figure 1D:
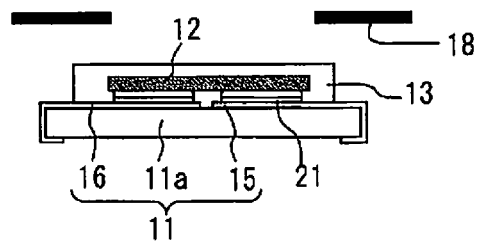
Figure 1E:
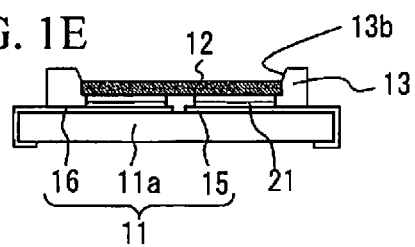

As shown in FIG. 1D, a metal mask 18 having an opening above the light emitting element 12 is then used to form a recess 13b in the light blocking member 13 by blasting so as to expose the upper surface of the light emitting element 12 as shown in FIG. 1E. The depth of the recess is 80 μm.

Formation of First Phosphor Layer and Second Phosphor Layer

Figure 1F:
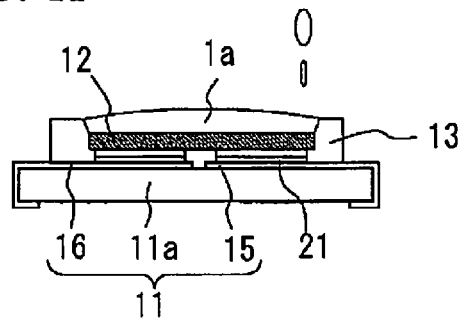

A slurry is prepared whose main component is a silicone resin containing an SCASN phosphor and a KSF:Mn phosphor as the first phosphor. As shown in FIG. 1F, the recess 13b is filled with the obtained slurry 1a by potting method. The slurry 1a shrinks when it cures, so it is used in an amount such that the surface of the slurry 1a will be higher than the outer peripheral face of the recess 13b, so that the upper surface of the first phosphor layer after curing will match up with the outer peripheral face of the recess 13b.

After this, the slurry 1a is heated and cured to form a first phosphor layer 1 with a thickness of 80 μm at the thickest part.

The KSF:Mn phosphor in this embodiment consists of particles with a median size of 20 μm and a Mohs hardness of approximately 2 to 4, while the SCASN phosphor in this embodiment consists of particles with a median size of 10 μm and a Mohs hardness of 6 to 7. These phosphors are contained in the silicone resin so that they account for about 30% of the total slurry weight. The viscosity of the slurry here is 1 to 2 pa/sec.

Within the cured first phosphor layer 1, the concentration of the phosphor is higher near the light emitting element 12 by settling of the phosphor. The concentration of the first phosphor in the first phosphor layer can be adjusted by means of the viscosity of the slurry, the average particle size of the first phosphor, the amount contained, the conditions during the curing of the slurry (temperature, time, etc.), and so forth. The side surfaces of the first phosphor layer 1 are completely covered by the light blocking member 13.

Figure 1G:
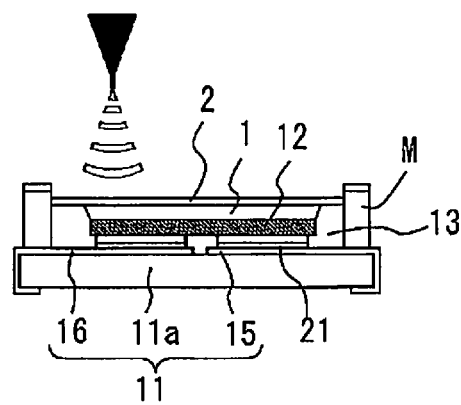

As shown in FIG. 1G, a mask M is then disposed an area where a second phosphor layer 2 will not be formed, and then the second phosphor layer 2 is formed over the first phosphor layer 1. The second phosphor layer 2 is formed in three layers by pulse spraying, using a slurry composed of a silicone resin containing a YAG phosphor. The total thickness of the second phosphor layer 2 is 50 μm. The second phosphor is a YAG:Ce phosphor with a median particle size of about 8 μm. Using the mask M allows the side surfaces of the second phosphor layer 2 to coincide with the side surfaces of the light blocking member 13, and keeps the second phosphor layer 2 from adhering to the side surfaces of the light blocking member 13.

Thus forming the first phosphor layer by a method other than spraying and forming the second phosphor layer by spraying prevents the first phosphor layer, which includes the fragile first phosphor, from being subjected to stress during manufacture, and ensures the desired shape and quality of the first phosphor. The first phosphor layer and the second phosphor layer can be suitably combined in terms of their types, the phosphor particle size, their concentration, their thickness, and so on, which allows the desired color to be realized as designed, and prevents color unevenness.

Figure 2A:
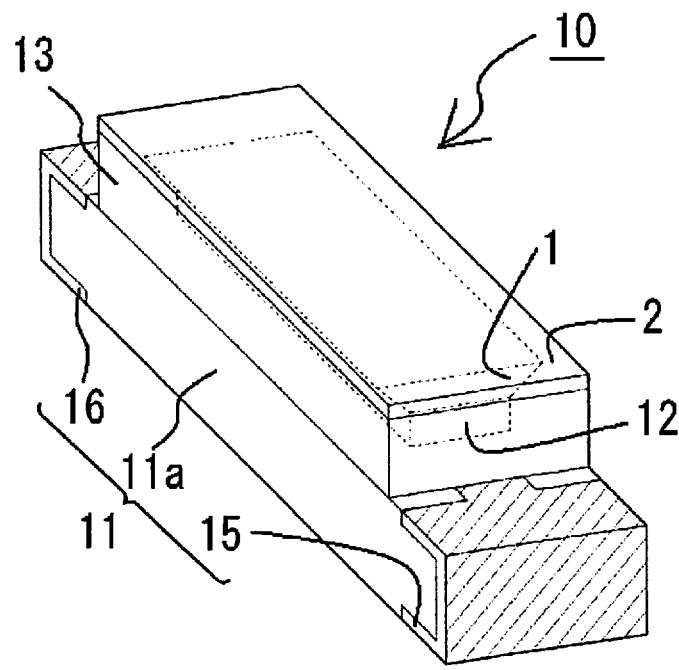
FIG. 2A is a schematic oblique view of a light emitting device manufactured by the method of FIGS. 1A to 1G.
Figure 2B:
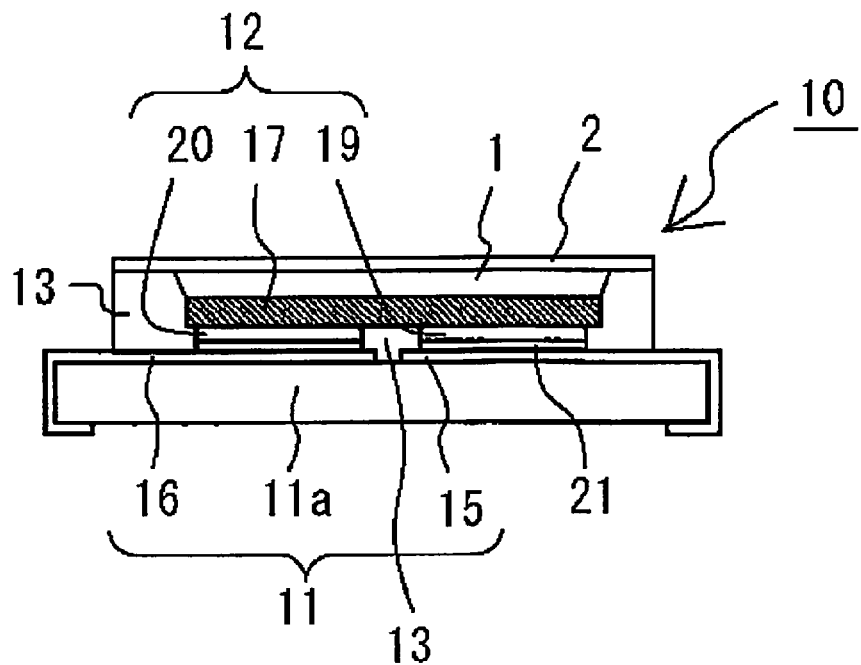
FIG. 2B is a schematic longitudinal sectional view of the light emitting device in FIG. 2A.

As shown in FIGS. 2A and 2B, the light emitting device 10 that is manufactured in this way mainly includes the light emitting element 12, the first phosphor layer 1, and the second phosphor layer 2. It also includes the light blocking member 13 that covers the light emitting element 12.

The light blocking member 13 has a recess that exposes the entire upper surface of the light emitting element 12 on its surface on the light extraction side of the light emitting device, and covers the entire side surfaces of the light emitting element 12. That is, around the upper surface of the light emitting element 12, the upper surface of the light blocking member is provided higher than the upper surface of the light emitting element. The light blocking member 13 is also disposed between the substrate 11 and the lower surface of the light emitting element 12.

The first phosphor layer 1, which has a upper surface that substantially coincides with the outer peripheral face of the recess 13b of the light blocking member 13, is disposed inside the recess 13b of the light blocking member 13. However, the first phosphor layer 1 may also be disposed on the outer peripheral face of the recess 13b of the light blocking member 13. The first phosphor layer 1 is a layer formed by a method other than spraying. If formed by potting, for example, the upper surface of the first phosphor layer 1 will be smooth, but it may gently slope toward the center of the recess. Also, since the amount of resin in the first phosphor layer 1 is relatively large, there may be portions in which the density of the first phosphor is higher and lower.

The second phosphor layer 2 is disposed over this first phosphor layer 1. The second phosphor layer 2 is produced by forming a plurality of extremely thin layers by the above-mentioned spraying method. Also, the density of the second phosphor in the second phosphor layer is high (the amount of binder that binds the phosphor or resin is smaller than in the first phosphor layer). Therefore, a visual inspection or a photograph may reveal that the surface of the second phosphor layer 2 is uneven along the particles of the phosphor.

The second phosphor layer 2 can cover the entire upper surface of the first phosphor layer 1, and the outer peripheral face of the recess 13b of the light blocking member 13.

Because the first phosphor layer 1 and the second phosphor layer 2 are thus disposed, the first phosphor layer containing the fragile phosphor can be covered by the light blocking member and the second phosphor layer, and this protects the first phosphor. Thus, wavelength conversion characteristics of the first phosphor can be maintained or improved, and the service life of the light emitting device can be increased.

In particular, if the side surfaces of the second phosphor layer 2 coincide with the side surfaces of the outer periphery of the light blocking member 13, second phosphor layer covers the opening of the recess in plan view and is formed larger than the opening, then the first phosphor layer provided inside the recess will be effectively covered, and a light emitting device that is more reliable can be obtained.

Embodiment 2: Method for Manufacturing Light Emitting Device

Figure 3A:
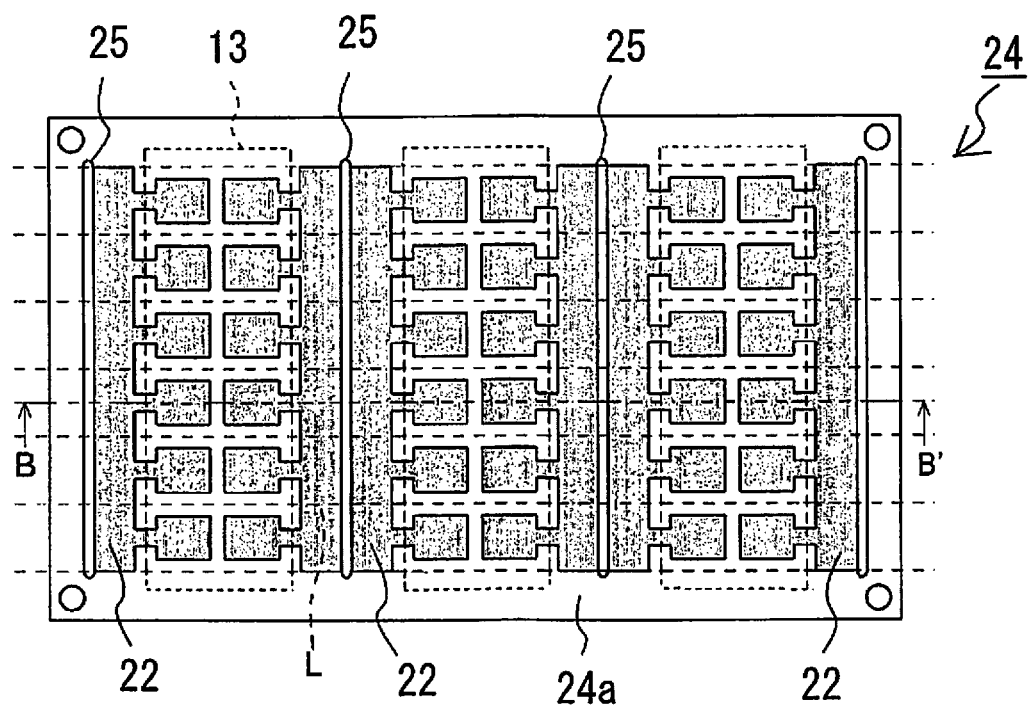
FIG. 3A is a schematic plan view of a substrate for illustrating another method of a light emitting element of another embodiment of the present invention.
Figure 3B:
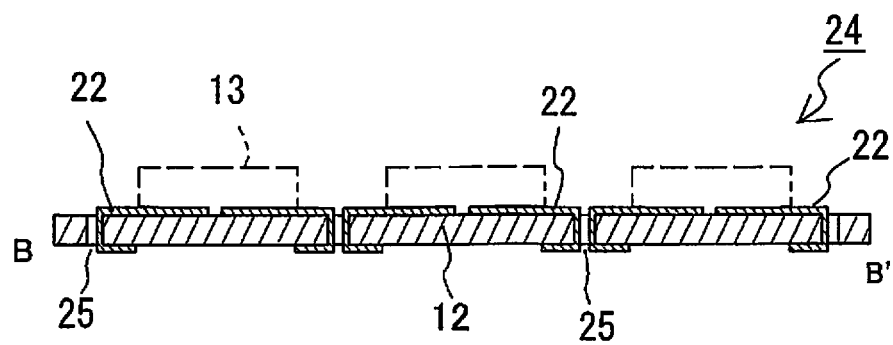
FIG. 3B is a B-B' line sectional view of FIG. 3A.

As shown in FIGS. 3A and 3B, with the method for manufacturing a light emitting device in this embodiment allows a plurality of light emitting devices to be manufactured, using a composite substrate 24 in which composite connection terminals 22 are formed in a base material 24a. This composite substrate 24 is configured such that a plurality of substrate of light emitting devices following their separation into individual devices are contiguous in a matrix (a plurality of columns and a plurality of rows).

This composite substrate 24 has slits 25 that extend from the upper surface to the lower surface of the base material 24a. The composite connection terminals 22 are provided continuously from the upper surface to the lower surface of the base material 24a of the composite substrate 24, through the inner walls of these slits 25.

FIG. 3A shows a composite substrate 24 that gives 18 light emitting devices, but when production efficiency is taken into account, the composite substrate 24 can be one that gives more light emitting devices (hundreds or thousands).

A plurality of light emitting elements 12 are connected on this composite substrate 24. The light blocking members 13 are formed by compression molding on the composite substrate so as to cover the side surfaces of the light emitting elements 12. At this point, it is preferable from the viewpoint of the production efficiency of the light blocking members if a series of light blocking members covering a plurality of light emitting elements is formed (that is, if a plurality of light blocking members are an integrated member). For example, it is preferable to form a plurality of light emitting elements arranged in a plurality of rows and columns, and to form a plurality of light blocking members in a single band that covers the plurality of light emitting elements arranged in one row. Furthermore, it is preferable in the case where the light blocking members are not formed on the slits in order to facilitate separation into individual devices (discussed below). An example of these light blocking members is in the case where they cover a plurality of light emitting elements arranged in a row, and are longer in the direction in which the slits extend (the direction along the short-side direction of the substrate), and are narrower than the distance between slits.

After this, a mask having openings above the light emitting elements 12 is used to perform blasting from the upper surface of the light blocking members 13. This forms recesses in the light blocking members 13 that expose the upper surfaces of the light emitting elements 12, above respective light emitting elements 12.

And then, a first phosphor layer is formed inside the recesses by the potting discussed above, on the upper surfaces of the exposed light emitting elements 12.

After this, a second phosphor layer is formed by the pulse spraying discussed above, on the upper surface of the first phosphor layer and the upper surfaces of the light blocking members 13.

The composite substrate 24 and the light blocking members 13 are then cut in one direction (a direction along the lengthwise direction of the substrate) along a division line L to separate into individual light emitting devices. The slits 25 are provided along the short-side direction of the substrates, at the ends in the lengthwise direction of the substrates, and light blocking members are not provided to the slits, so there is no need to cut in the direction in which the slits extend, and the individual light emitting devices can be separated in relatively few steps.

A dicer, a laser, or the like can be used for cutting.

This manufacturing method has substantially the same effect as that in Embodiment 1.

Embodiment 3: Method for Manufacturing Light Emitting Device

Figure 4:
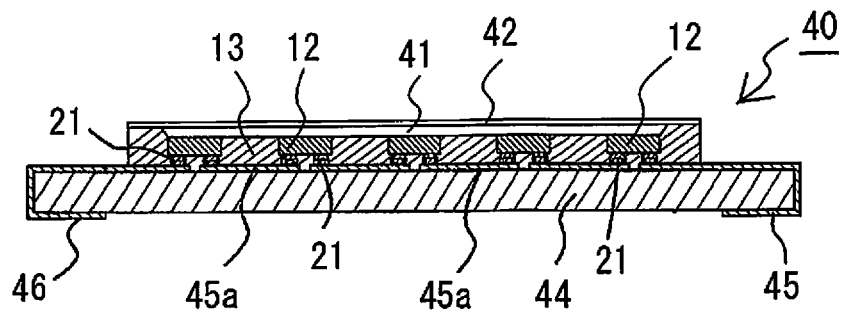
FIG. 4 is a schematic longitudinal sectional view illustrating another method of a light emitting device of another embodiment of the present invention.

As shown in FIG. 4, the method for manufacturing a light emitting device in this embodiment makes use of a composite substrate in which composite connection terminals 45, 45a, and 46 are formed in a base material 44. This composite substrate is the substrate for a single light emitting device for installing a plurality of light emitting elements 12.

FIG. 4 shows the composite substrate for a light emitting device includes 5 light emitting elements, but the composite substrate for a light emitting device includes a smaller number or a larger number (several hundreds to several thousands) of light emitting elements may be used.

The light emitting elements 12 are connected to this composite substrate, the light blocking members 13 are molded all at once by compression molding so as to cover the side surfaces of the light emitting elements 12, and a molded article is taken off.

After this, part of the light blocking members 13 above the light emitting elements 12 is removed in the substantially same manner as above, and the light blocking members 13 are formed in the recess in which the upper surfaces of the light emitting elements 12 are exposed.

And then, a first phosphor layer 41 is formed by potting, integrally with a plurality of light emitting elements, so as to fit in the recess just as above, and a second phosphor layer 42 is formed by pulse spraying as discussed above, on the upper surface of the first phosphor layer 41 and the upper surfaces of the light blocking members.

This manufacturing method has substantially the same effect as that in Embodiment 1.

Embodiment 4: Method for Manufacturing Light Emitting Device

Figure 5:
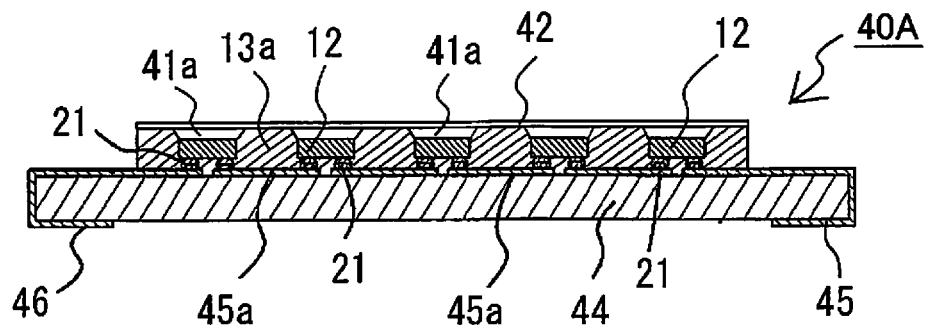
FIG. 5 is a schematic sectional view illustrating another method of a light emitting device of still another embodiment of the present invention.

As shown in FIG. 5, with the method for manufacturing a light emitting device in this embodiment, light blocking member 13a has recesses. Each of the recesses is provided on the individual light emitting elements 12 and upper surfaces of the light emitting elements 12 are exposed from the light blocking member 13a.

After this, first phosphor layers 41a are formed by potting in the recesses corresponding to the light emitting elements 12, and a second phosphor layer 42 is formed by pulse spraying as discussed above, on the upper surface of the first phosphor layer 41 and the upper surface of the light blocking member 13a. This manufacturing method has substantially the same effect as that in Embodiments 1 and 3.

Embodiment 5: Method for Manufacturing Light Emitting Device

With the method for manufacturing a light emitting device in this embodiment, first:

(A) a recess in the inside of which a light emitting element is housed, and connection terminals that are electrically connected to the light emitting elements are provided, (B) a light emitting element is prepared, (C) a light emitting element is mounted on a substrate, and (D) the light emitting element and the connection terminals are electrically connected.

(A) Preparation of Substrate

Figure 6:
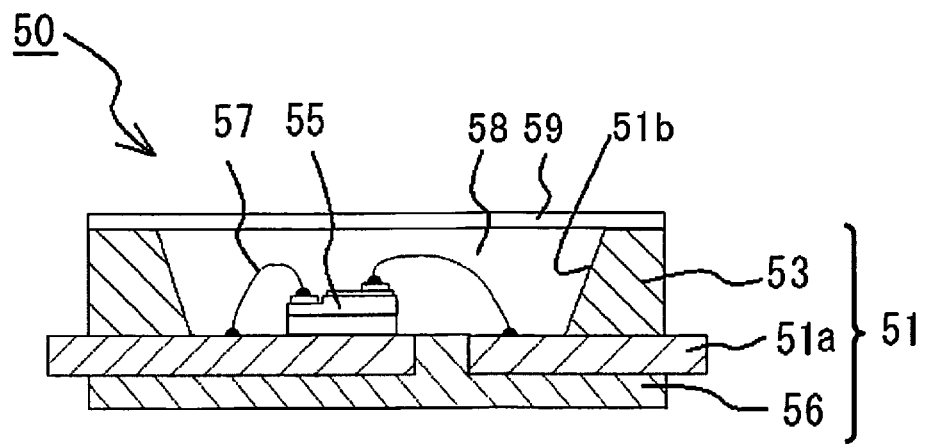
FIG. 6 is a schematic sectional view illustrating another method of a light emitting device of still another embodiment of the present invention.

As shown in FIG. 6, a substrate 51 is prepared which includes a light blocking member 53 that is substantially cuboid, is composed of a white epoxy resin, and has a recess 51b, and a pair of connection terminals 56 that are exposed on the bottom of the recess 51b and stick out from the side surface of a base material 51a.

(B) Preparation of Light Emitting Element

As shown in FIG. 6, a light emitting element 55 includes a semiconductor laminate 17 composed of an n-type semiconductor layer, a light emitting layer, and a p-type semiconductor layer laminated over a sapphire substrate, a first electrode that is connected to the n-type semiconductor layer, and a second electrode that is connected to the p-type semiconductor layer. The first and second electrodes are provided on the face that is on the opposite side from the sapphire substrate.

The light emitting element is formed by known method in this art.

(C) Mounting of Light Emitting Element

Next, the light emitting element 55 is mounted on the bottom of the recess 51b of the substrate 51. A eutectic solder (Au—Sn) is used to join the lower surface of the light emitting element 55 to the connection terminals 56 exposed from the bottom of the recess 51b of the substrate 51.

(D) Electrical Connection of Light Emitting Element

Then, the first and second electrodes of the light emitting element 55 are connected with silver alloy wires 57 to the pair of connection terminals 56 exposed at the bottom of the recess 51b.

Formation of First Phosphor Layer and Second Phosphor Layer

A first phosphor layer 58 is formed by potting a slurry containing an SCASN phosphor so as to fill the recess 51b, and then curing.

After this, three layers of the second phosphor layer containing LAG are formed by spraying over the first phosphor layer 58 to form a second phosphor layer 59. Here, the second phosphor layer 59 also covers the upper surface of the light blocking member 53, and the outer edge of the second phosphor layer 59 coincides with the outer edge of the light blocking member 53.

This manufacturing method has substantially the same effect as that in Embodiments 1 and 3.

Modification Example of Embodiment 5

Figure 10:
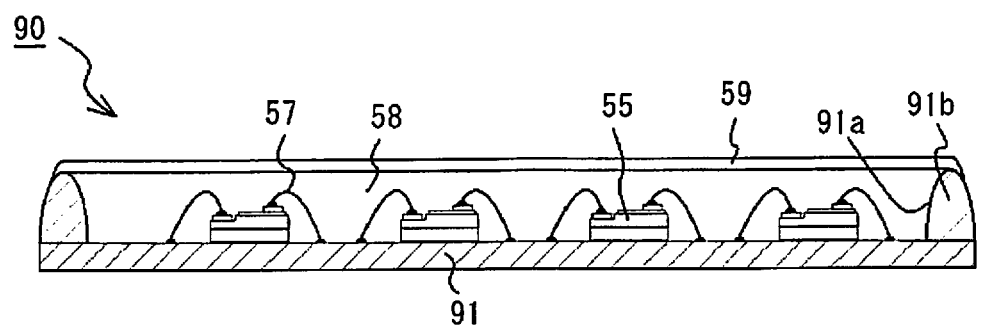
FIG. 10 is a schematic sectional view illustrating another method of a light emitting device of still another embodiment of the present invention.

As shown in FIG. 10, with the method for manufacturing a light emitting device 90 in this embodiment, a substrate 91 is prepared which includes a light blocking member 91b that forms a recess 91a and is a silicone resin containing titanium oxide, on the upper surface of a ceramic base material with a flat shape, and a plurality of pairs of connection terminals that are exposed at the bottom of the recess 91a and are formed on the surface of the base material.

Other than installing a plurality of the light emitting elements 55 on the substrate 91, the light emitting device 90 is formed by substantially the same manufacturing method as in Embodiment 5, such as potting the first phosphor layer, and spraying on the second phosphor layer. This manufacturing method has substantially the same effect as that in Embodiment 1 or 2.

Embodiment 6: Method for Manufacturing Light Emitting Device

Figure 8:
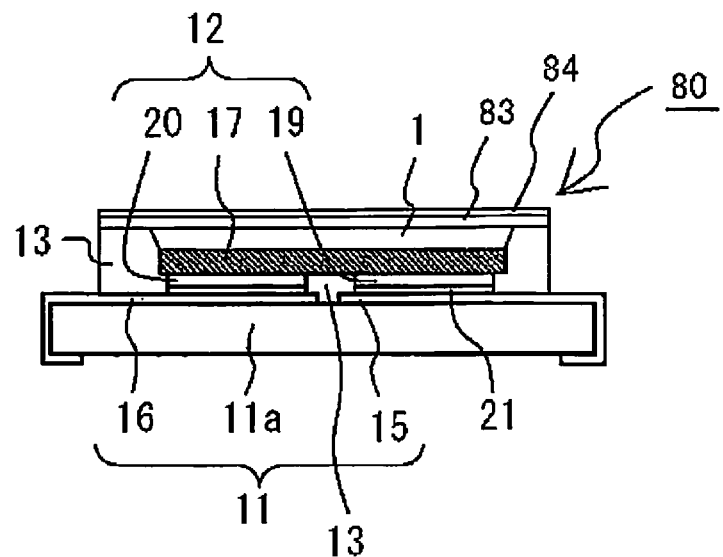
FIG. 8 is a schematic sectional view illustrating another method of a light emitting device of still another embodiment of the present invention.

As shown in FIG. 8, with the method for manufacturing a light emitting device in this embodiment, the first phosphor layer 1 is formed by printing in the recess of the light blocking member 13, after which a phosphor-containing piece of glass 83 that contains a wavelength conversion member and is translucent is affixed via a translucent silicone resin over the light blocking member 13 and the upper surface of the first phosphor layer 1. A second phosphor layer 84 is formed by the above-mentioned pulse spraying over this phosphor-containing piece of glass 83. Otherwise, a light emitting device is manufactured by substantially the same manufacturing process as in Embodiment 1 or 2. This manufacturing method has substantially the same effect as that in Embodiment 1 or 2.

Embodiment 7: Method for Manufacturing Light Emitting Device

Figure 9:
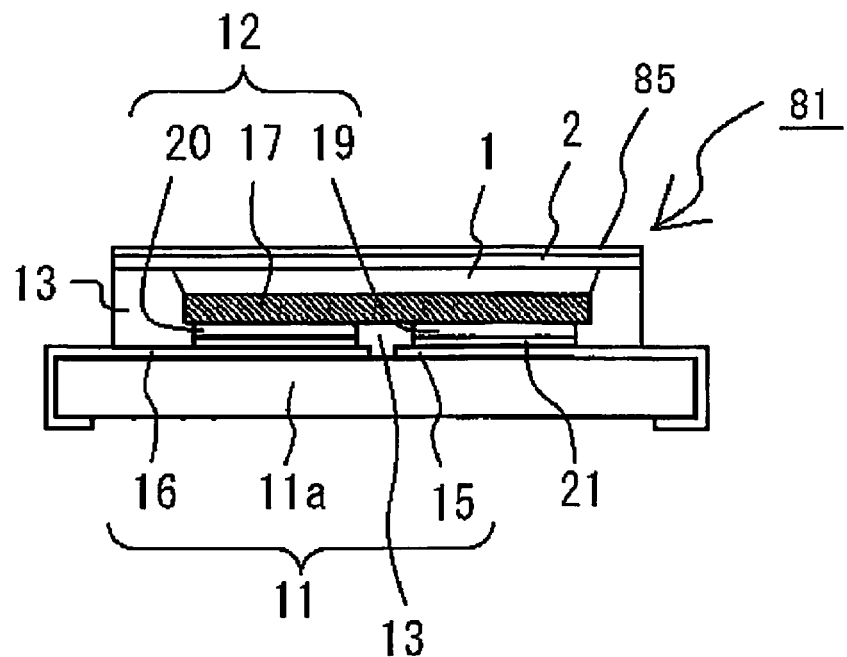
FIG. 9 is a schematic sectional view illustrating another method of a light emitting device of still another embodiment of the present invention.

As shown in FIG. 9, with the method for manufacturing a light emitting device 81 in this embodiment, the first phosphor layer 1 is formed by printing in the recess of the light blocking member 13, after which the second phosphor layer 2 is formed by the above-mentioned pulse spraying. A phosphor-containing resin sheet 85 is then affixed over the second phosphor layer 2.

Otherwise, a light emitting device is manufactured by substantially the same manufacturing process as in Embodiment 1 or 2. This manufacturing method has substantially the same effect as that in Embodiment 1 or 2.

Embodiment 8: Method for Manufacturing Light Emitting Device

Figure 11:
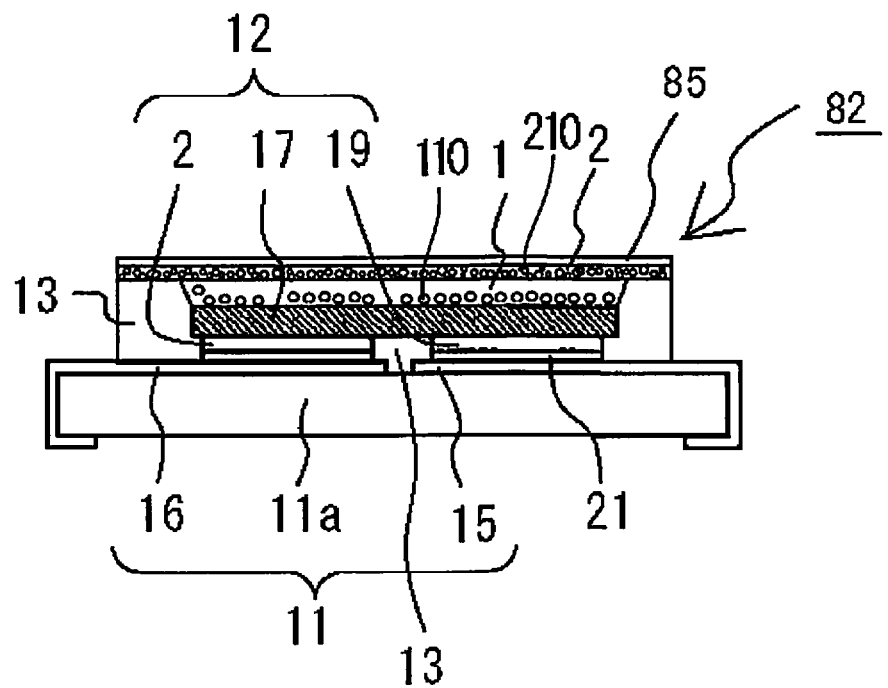
FIG. 11 is a schematic sectional view illustrating another method of a light emitting device of still another embodiment of the present invention.

As shown in FIG. 11, with the method for manufacturing a light emitting device 82 in this embodiment, the first phosphor layer 1 is formed by potting in the recess of the light blocking member 13, after which the second phosphor layer 2 is formed by the above-mentioned pulse spraying. The first phosphor layer 1 is formed along with a light transmissive material (binder) by potting or the like, the concentration of the first phosphor 110 is higher at a position near the light emitting element 12 in the thickness direction of the first phosphor layer 1. A concentration of the first phosphor 110 contained in the first phosphor layer 1 is less than a concentration of the second phosphor 210 contained in the second phosphor layer 2.

Otherwise, a light emitting device is manufactured by substantially the same manufacturing process as in Embodiment 1 and 2.

INDUSTRIAL APPLICABILITY

The light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method for manufacturing a light emitting device comprising:
    mounting a light emitting element on a base member;
    forming a light blocking member after the mounting of the light emitting element to cover at least a side surface of the light emitting element such that the light blocking member contacts with at least a part of the side surface of the light emitting element, the light blocking member including a resin;
    forming a first phosphor layer after the forming of the light blocking member, the first phosphor layer including a first phosphor that is based on KSF or quantum dots on the light emitting element by a method other than spraying; and
    forming a second phosphor layer including a second phosphor that is different from the first phosphor on the first phosphor layer by spraying.

2. The method of manufacturing the light emitting device according to claim 1, wherein
    the second phosphor is a phosphor with higher hardness than that of the first phosphor.

3. The method of manufacturing the light emitting device according to claim 1, wherein
    the first phosphor layer is formed by potting.

4. The method of manufacturing the light emitting device according to claim 1, wherein
    the second phosphor is a phosphor with better weather resistance than that of the first phosphor.

5. The method of manufacturing the light emitting device according to claim 1, wherein
    the first phosphor further includes at least one selected from the group consisting of materials based on CaS, $SrGa_2S_4$, $SrAl_2O_4$ and CASN, and the second phosphor is at least one selected from the group consisting of materials based on garnet, β-SiAlON and chlorosilicate.

6. The method of manufacturing the light emitting device according to claim 1, wherein
    the second phosphor is a phosphor with higher water resistance than that of the first phosphor.

7. The method of manufacturing the light emitting device according to claim 1, wherein
    a concentration of the first phosphor contained in the first phosphor layer is less than a concentration of the second phosphor contained in the second phosphor layer.

8. The method of manufacturing the light emitting device according to claim 1, wherein
    the first phosphor and the second phosphor are in the form of particles, and the first phosphor has an average particle size that is larger than the average particle size of the second phosphor.

9. The method of manufacturing the light emitting device according to claim 1, wherein
    a thickness of the first phosphor layer is more than a thickness of the second phosphor layer.

10. The method of manufacturing the light emitting device according to claim 1, wherein
    a thickness of the first phosphor layer is 200 μm or less, and a thickness of the second phosphor layer is 100 μm or less.

11. The method of manufacturing the light emitting device according to claim 1, wherein the forming of the light blocking member includes forming the light blocking member before the forming of the first phosphor layer, the light blocking member has a recess which exposes the light emitting element, and
    the forming of the first phosphor layer includes forming the first phosphor layer on the light emitting element exposed via the recess.

12. The method of manufacturing the light emitting device according to claim 11, wherein
    the forming of the light blocking member includes forming the light blocking member to cover side surfaces of the light emitting element.

13. The method of manufacturing the light emitting device according to claim 11, wherein
    the forming of the first phosphor layer includes forming the first phosphor layer such that the sides of the first phosphor layer are covered by the light blocking member.

14. The method of manufacturing the light emitting device according to claim 11, wherein
    the forming of the second phosphor layer includes forming the second phosphor layer to cover an upper surface of the light blocking member.

15. The method of manufacturing the light emitting device according to claim 11, wherein the forming of the light blocking member includes:
    forming the light blocking member to a height that covers the light emitting element, and
    selectively-removing part of an upper surface of the light blocking member to expose an upper surface of the light emitting element, whereby forming the recess which exposes the light emitting element.

16. The method of manufacturing the light emitting device according to claim 1, further comprising
    preparing a substrate including a base material provided with connection terminals that are electrically connected to the light emitting element, and
    mounting the light emitting element on the substrate.

17. The method of manufacturing the light emitting device according to claim 1, wherein
    the first phosphor and the second phosphor are in the form of particles
    an average particle size of the first phosphor and the second phosphor is 30 μm or less.

18. The method of manufacturing the light emitting device according to claim 1, wherein
    the first phosphor layer is formed with the first phosphor and a binder such that the concentration of the first phosphor at a position near the light emitting element is higher than that at other positions far from the light emitting element in the thickness direction of the first phosphor layer, and the second phosphor layer is formed such that the concentration in which the second phosphor is contained in the second phosphor layer is substantially uniform.

19. The method of manufacturing the light emitting device according to claim 1, wherein the second phosphor layer is formed by laminating a plurality of layers.

* * * * *